United States Patent
Olsen et al.

(10) Patent No.: US 11,972,178 B2
(45) Date of Patent: Apr. 30, 2024

(54) SYSTEM AND METHOD FOR EXPLANATION OF CONDITION PREDICTIONS IN COMPLEX SYSTEMS

(71) Applicant: Falkonry Inc., Sunnyvale, CA (US)

(72) Inventors: Gregory Olsen, Menlo Park, CA (US); Dan Kearns, Half Moon Bay, CA (US); Peter Nicholas Pritchard, Sunnyvale, CA (US); Nikunj Mehta, Cupertino, CA (US)

(73) Assignee: Falkonry Inc., Cupertino, CA (US)

( * ) Notice: Subject to any disclaimer, the term of this patent is extended or adjusted under 35 U.S.C. 154(b) by 117 days.

(21) Appl. No.: 15/906,702

(22) Filed: Feb. 27, 2018

(65) Prior Publication Data

US 2019/0265674 A1 Aug. 29, 2019

(51) Int. Cl.
*G06N 20/00* (2019.01)
*G05B 19/4063* (2006.01)
*G06F 30/20* (2020.01)

(52) U.S. Cl.
CPC ......... *G05B 19/4063* (2013.01); *G06F 30/20* (2020.01); *G06N 20/00* (2019.01); *G05B 2219/32058* (2013.01)

(58) Field of Classification Search
CPC ...... G05B 19/4063; G06F 30/20; G06N 20/00
See application file for complete search history.

(56) References Cited

U.S. PATENT DOCUMENTS

| | | | |
|---|---|---|---|
| 6,801,867 B2 | 10/2004 | Bortnyk | |
| 7,191,106 B2 | 3/2007 | Minor et al. | |
| 8,001,062 B1* | 8/2011 | Gargi | G06K 9/00536 |
| | | | 706/12 |
| 8,285,438 B2 | 10/2012 | Mylaraswamy et al. | |
| 9,043,079 B2 | 5/2015 | Tsuchikiri et al. | |
| 2003/0018595 A1* | 1/2003 | Chen | G06K 9/6228 |
| | | | 706/12 |
| 2012/0041575 A1* | 2/2012 | Maeda | G05B 23/024 |
| | | | 700/80 |
| 2012/0290879 A1* | 11/2012 | Shibuya | G05B 23/021 |
| | | | 714/26 |
| 2013/0332773 A1* | 12/2013 | Yuan | G05B 23/0229 |
| | | | 714/26 |
| 2015/0219530 A1* | 8/2015 | Li | G06F 17/18 |
| | | | 702/181 |

(Continued)

OTHER PUBLICATIONS

Quirino, Thiago, et al. "Collateral representative subspace projection modeling for supervised classification." 2006 18th IEEE International Conference on Tools with Artificial Intelligence (ICTAI'06). IEEE, 2006. (Year: 2006).*

(Continued)

*Primary Examiner* — David A Hopkins
(74) *Attorney, Agent, or Firm* — Duane Morris LLP

(57) ABSTRACT

A system and methods to identify which signals are significant to an assessment of a complex machine system state in the presence of non-linearities and disjoint groupings of condition types. The system enables sub-grouping of signals corresponding to system sub-components or regions. Explanations of signal significance are derived to assist in causal analysis and operational feedback to the system is prescribed and implemented for the given condition and causality.

18 Claims, 8 Drawing Sheets

(56) References Cited

U.S. PATENT DOCUMENTS

| | | | |
|---|---|---|---|
| 2015/0222495 A1* | 8/2015 | Mehta | G06F 3/0484 715/736 |
| 2015/0276557 A1* | 10/2015 | Masuda | G05B 23/0243 702/182 |
| 2016/0328654 A1 | 11/2016 | Bauer et al. | |
| 2017/0011741 A1* | 1/2017 | Hershey | G06V 30/194 |
| 2017/0017901 A1* | 1/2017 | Firooz | G05B 13/0265 |
| 2017/0053399 A1* | 2/2017 | Xu | G06T 7/0012 |
| 2018/0322394 A1* | 11/2018 | Nguyen | G06N 3/08 |
| 2019/0034497 A1* | 1/2019 | Song | G06F 16/2477 |
| 2019/0230119 A1* | 7/2019 | Mestha | G05B 23/0297 |

OTHER PUBLICATIONS

Marchiori, Elena. "Hit miss networks with applications to instance selection." Journal of Machine Learning Research9.Jun. 2008: 997-1017. (Year: 2008).*

Shin, Hyunjung, and Sungzoon Cho. "Neighborhood property-based pattern selection for support vector machines." Neural Computation 19.3 (2007): 816-855. (Year: 2007).*

Brun, Marcel, et al. "Model-based evaluation of clustering validation measures." Pattern recognition 40.3 (2007): 807-824. (Year: 2007).*

Zhao, Mingbo, et al. "Fault diagnosis of rolling element bearings via discriminative subspace learning: visualization and classification." Expert Systems with Applications 41.7 (2014): 3391-3401. (Year: 2014).*

Jirina, Marcel. "Utilization of singularity exponent in nearest neighbor based classifier." Journal of classification 30.1 (2013): 3-29. (Year: 2013).*

Xia, Shuyin, et al. "Relative density based support vector machine." Neurocomputing 149 (2015): 1424-1432. (Year: 2015).*

Kong, Xianguang, et al. "Research on real time feature extraction method for complex manufacturing big data." The International Journal of Advanced Manufacturing Technology 99.5-8 (2018): 1101-1108. (Year: 2018).*

David Page, Course Notes for CS 760: Machine Learning, Spring 2017, Course, University of Wisconsin-Madison (Year: 2017).*

Wikipedia, "Confusion Matrix", access via the Wayback Machine, archive date Nov. 26, 2017 (Year: 2017).*

CK-12 Foundation, article "8.10 Conversion of Decimals and Fractions as Percent", from the eBook "CK-12 Middle School Math Concepts—Grade 6", accessed via website on May 18, 2020 (Year: 2020).*

Velldal, "INF4820: Algorithms for AI and NLP", University of Oslo, Sep. 25, 2013, course notes for "Evaluating Classifiers Clustering" (Year: 2013).*

Sunil Ray, "30 Questions to test a data scientist on K-Nearest Neighbors (kNN) Algorithm", Sep. 4, 2017, accessed online via the blog of Analytics Vidhya (Year: 2017).*

Kumar Skand, "kNN (k-Nearest Neighbour) Algorithm in R", Oct. 8, 2017, accessed online via RPubs by Rstudio online (Year: 2017 ).*

Izzet Sirin, "Learning with Feature Partition", Aug. 1993, Bilkent University, Masters Thesis, accessed online (Year: 1993).*

Merriam-Webster's Dictionary, "specific", accessed electronically on May 18, 2020 (Year: 2020).*

Merriam-Webster's Dictionary, "certain", accessed electronically on May 18, 2020 (Year: 2020).*

UCLA, "AP Statistics Curriculum 2007 Hypothesis Basics", Wiki article from "Probability and statistics EBook", accessed online—see the confusion table in the section "Type I Error, Type II Error and Power" (Year: 2007).*

Zhou, Peiyuan. "Pattern discovery from multivariate time series data." (2017). (Year: 2017).*

Li, Hailin. "Accurate and efficient classification based on common principal components analysis for multivariate time series." Neurocomputing 171 (2016): 744-753. (Year: 2016).*

Esling, Philippe, and Carlos Agon. "Time-series data mining." ACM Computing Surveys (CSUR) 45.1 (2012): 1-34. (Year: 2012).*

Li, Sheng, Yaliang Li, and Yun Fu. "Multi-view time series classification: A discriminative bilinear projection approach." Proceedings of the 25th ACM International on Conference on Information and Knowledge Management. 2016. (Year: 2016).*

Ma, Junshui, and Simon Perkins. "Time-series novelty detection using one-class support vector machines." Proceedings of the International Joint Conference on Neural Networks, 2003.. vol. 3. IEEE, 2003. (Year: 2003).*

Amershi, Saleema, et al. "Modeltracker: Redesigning performance analysis tools for machine learning." Proceedings of the 33rd Annual ACM Conference on Human Factors in Computing Systems. 2015. (Year: 2015).*

Basu, Sabyasachi, and Martin Meckesheimer. "Automatic outlier detection for time series: an application to sensor data." Knowledge and Information Systems 11.2 (2007): 137-154. (Year: 2007).*

Fulcher, Ben D., and Nick S. Jones. "Highly comparative feature-based time-series classification." IEEE Transactions on Knowledge and Data Engineering 26.12 (2014): 3026-3037. (Year: 2014).*

Xing, Zhengzheng, Jian Pei, and Eamonn Keogh. "A brief survey on sequence classification." ACM Sigkdd Explorations Newsletter 12.1 (2010): 40-48. (Year: 2010).*

Yanping Chen, Eamonn Keogh, Bing Hu, Nurjahan Begum, Anthony Bagnall, Abdullah Mueen and Gustavo Batista (2015). The UCR Time Series Classification Archive, accessed via University of California Riverside Website (Year: 2015).*

Arbawa, Yoke Kusuma, and Candra Dewi. "Soil Nutrient Content Classification for Essential Oil Plants using kNN." (2020). (Year: 2020).*

Darling, Michael Christopher, and David John Stracuzzi. Toward uncertainty quantification for supervised classification. No. SAND-2018-0032. Sandia National Lab.(SNL-NM), Albuquerque, NM (United States), 2018. (Year: 2018).*

Basu, Tanmay, C. A. Murthy, and Himadri Chakrabarty. "A tweak on k-nearest neighbor decision rule." Proceedings of the International Conference on Image Processing, Computer Vision, and Pattern Recognition (IPCV). 2012 (Year: 2012).*

Ko, Albert Hung-Ren, Robert Sabourin, and Alceu de Souza Britto. "A new dynamic ensemble selection method for numeral recognition." International Workshop on Multiple Classifier Systems. Springer, Berlin, Heidelberg, 2007. (Year: 2007).*

Zhang, Xiuzhen, et al. "KRNN: k Rare-class Nearest Neighbour classification." Pattern Recognition 62 (2017): 33-44. (Year: 2017).*

Rashid, Khandakar M., and Joseph Louis. "Times-series data augmentation and deep learning for construction equipment activity recognition." Advanced Engineering Informatics 42 (2019): 100944. (Year: 2019).*

The International Searching Authority, "Search Report" in application No. PCT/US2019/015802, dated Apr. 23, 2019, 15 pages.

Current Claims in application No. PCT/US2019/015802, dated Apr. 2019, 4 pages.

Japanese Patent Office "Office Action" in Application No. 2020-545103, dated Oct. 14, 2021, 3 pages.

European Patent Office "Search Report" in Application No. 19760889.6-1205, dated Oct. 22, 2021, 15 pages.

Current Claims in Application No. 2020-545103, dated Oct. 14, 2021, 5 pages.

Current Claims in Application No. 19760889.6, dated Oct. 21, 2021, 4 pages.

* cited by examiner

SYSTEM AND METHOD FOR EXPLANATION OF CONDITION PREDICTIONS IN COMPLEX SYSTEMS

BACKGROUND

Power plants, waste water treatment plants, factories, airplanes, and automobiles are some examples of complex systems that include multiple machines operating to accomplish objectives. These complex systems include physical components that degrade over time, components that fail, and components that are being used incorrectly or suboptimally. Degradation, failure, or incorrect or sub-optimal use of a given component in the system may affect other components of the system that depend on the given component.

As a component operates in the system, the component may be configured to operate differently during different operating states. For example, a machine may power up, warm up, run, cool down, and shut down. The machine may be configured to produce little or no output during the power up state, whereas the machine may be configured to produce maximum output during the run state. Regardless of how a component is configured, the component can behave unexpectedly in any operating state. In a complex system, multiple components may behave unexpectedly for a long period of time even though the system as a whole may operate relatively efficiently over that period of time.

Operation of various components in the system may be monitored using sensors, which measure and report data about the operational behavior of the components. The sensors themselves are also susceptible to degradation, failure, and sub-optimal use, and this susceptibility creates uncertainty around the measurements themselves and around the behavior of the components in the system. The sensors may feed into customized triggers that provide alerts when measurements go outside certain boundaries. The customized triggers may be set up by engineers, such as maintenance engineers, that are assigned to oversee operation and maintenance of the machines and to promote overall health and efficiency of the system.

Accordingly, the overall health and efficiency of the system may be highly dependent on the knowledge, skill, expertise, and accuracy of the maintenance engineer, who is a human being. The overall health and efficiency of the system may also depend on a variable degree of uncertainty surrounding the sensors and the behavior of the components in the systems. In light of the complexity of the system, there are often few human beings who are able to make the accurate judgments required by the maintenance engineer, and even fewer who are available to verify the correctness of the judgments made by the maintenance engineer. Although the output of a given system may be observed at a high level, there is usually little or no knowledge of how much better the maintenance engineer could be performing.

Further, some machines come with manuals or specifications that explain, to the maintenance engineer, how frequently to perform certain maintenance operations on the machines. Due to the wide variety of systems and changing operating environments in which the machines may be used, such manuals or specifications often grossly over-estimate or under-estimate the frequency in which such maintenance should be performed in a given environment. Such problems are often difficult to detect and often lead to inefficiencies that exponentially increase as the size and complexity of the system increases.

Being able to classify the state of a complex system over time is a very powerful tool and a may influence an operational response. Once the state of a system at a particular time is known, having further information, such as determining the subpart of the system most likely responsible or involved in the state, determining the set of signals to distinguishes this state, and determining the cause of the system being in this state, may lead to more effective and efficient intervention in the operation of the system.

However, there are difficulties using a multivariate, time-series based analysis method. First, the classification models are non-linear. Thus, there is no simple way to attribute which signal values led to the result directly from the model. Second, the same class (or condition result) may occur with many different combinations of signal traces. For example, different occurrences of a "Warning" condition may be associated with many combinations of individual signal patterns. For this reason, conventional methods that utilize aggregate analysis that may determine "which signal is most typically associated with condition X" may be seriously misleading. Third, groupings of signals (such as those corresponding to a specific sub-component, such as a joint in a robot or a section of a plant) are important, but may require system understanding for guidance. Finally, the classification analysis reveals correlation, which does not imply causation. The identification of the signals that more significantly contribute to a condition assessment may assist causal analysis, but some understanding of physical mechanisms in the system may enable reaching causality conclusions.

BRIEF SUMMARY

"Explanation" for a condition at time, t, is the identification of the signals that are strongly associated with that condition result. In general, more than one signal may be strongly associated with a condition value. The mapping of signals of interest from features used in modeling is performed. Models that produce good prediction results may produce poor explanation results, and to achieve quality explanation results, the produced model is independently built for explanation. The systems and methods generate independent models for prediction and explanation based on signal traces and any provided labels. The systems and methods operate in semi-supervised and unsupervised scenarios and provide explanation results directly in terms of the provided signals (as opposed to complex engineered features), and the results are not highly sensitive to the choice of signals used or redundancy among the signals chosen (as they can be for approaches like linear regression).

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

A system and methods are disclosed to identify which signals are "significant" to each individual assessment result even in the presence of non-linearities and disjoint groupings of condition types. The system enables sub-grouping of signals corresponding to system sub-components or regions. Causality conclusions may then be reached with this understanding of physical mechanisms in the system, and operational feedback to the system may be prescribed and implemented for the given condition and causality. For example, the causality conclusions can provide operation feedback to direct maintenance engineers that are assigned to oversee operation and maintenance of the system to remediate faulty components or otherwise address the identified conditions in order to promote overall health and efficiency of the system.

Figure 1:
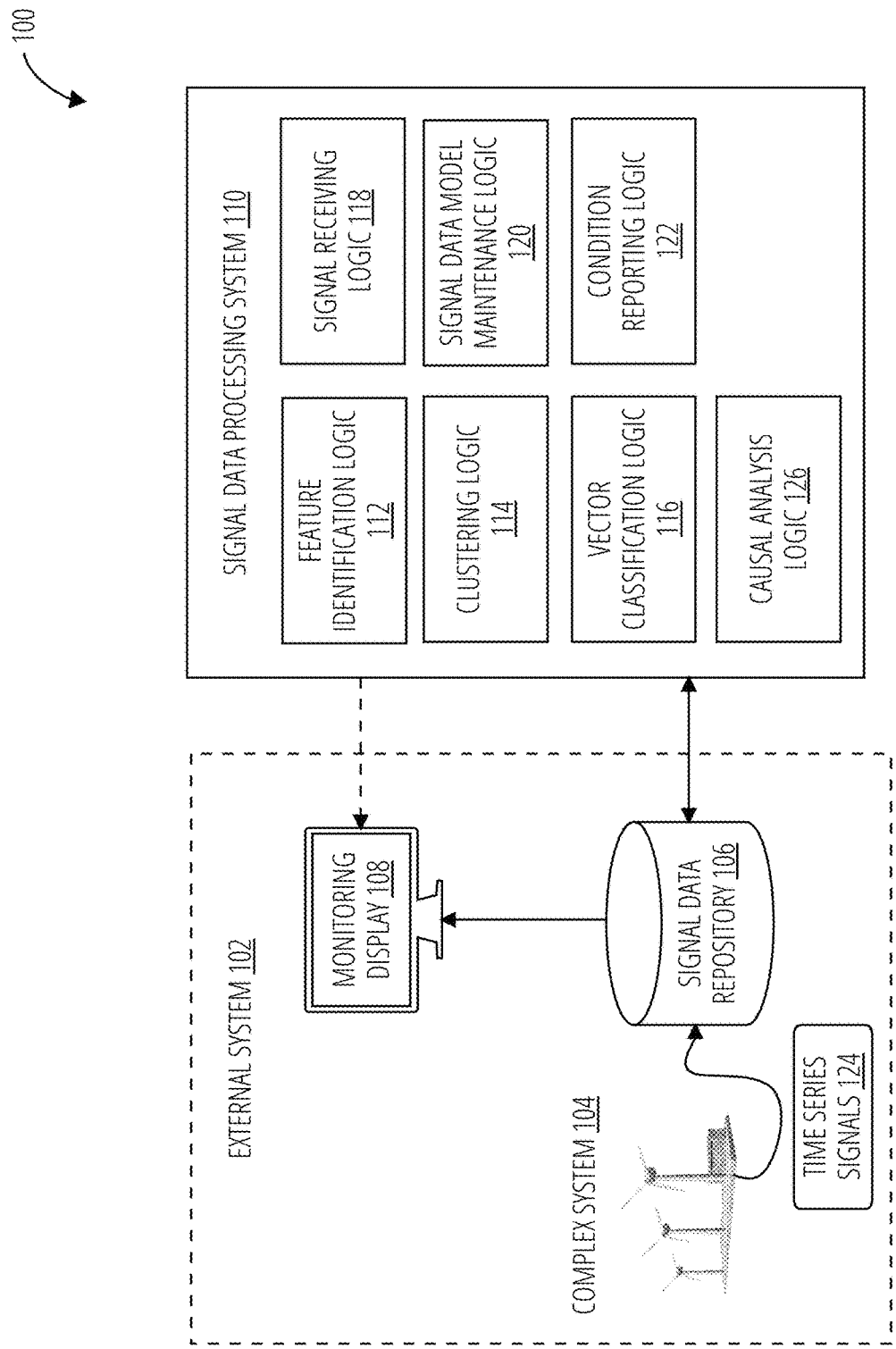
FIG. 1 illustrates an embodiment of a signal classification and explanation system 100.

Referring to FIG. 1, a signal classification and explanation system 100 comprises an external system 102 and a signal data processing system 110. The external system 102 further comprises a complex system 104, a signal data repository 106, and a monitoring display 108. The signal data processing system 110 further comprises feature identification logic 112, clustering logic 114, vector classification logic 116, signal receiving logic 118, signal data model maintenance logic 120, condition reporting logic 122, and causal analysis logic 126, which is the focus of this disclosure.

The complex system 104 may represent a complex industrial machine such as complex factory equipment, commercial vehicles, aircrafts, or any other complex machinery that utilizes multiple sensors to monitor the state of the machinery. The complex system 104 may also represent a complex sensor package that includes multiple types of sensors designed to function as an activity tracker, such as wireless-enabled wearable technology devices.

The complex system 104 may be communicatively coupled to the signal data repository 106 for the purposes to sending a data stream of signal data from multiple sensors attached to the complex system 104. The data stream of signal data may represent multiple data observations collected by the multiple sensors. The purpose of the multiple sensors on the complex system 104 is to record observations occurring at various points within the complex system 104. For example, if the complex system 104 is at power plant made up of multiple windmills that generate energy from the wind, then the multiple sensors may include sensors that measure the rotational speed of each individual windmill, sensors that measure the electrical charge generated by each windmill, and sensors that mea-sure the current storage levels of electricity generated by the electrical generators within the power plant. In another example, the complex system 104 may represent a wireless activity tracker. In this case, the multiple sensors may be configured to detect changes occurring to the wearer and positional changes based on movement. For instance, the set of sensors may include, but are not limited to, a global positioning sensor (GPS), a 3-axis accelerometer, a 3-axis gyroscope, a digital compass, an optical heart rate monitor, and an altimeter. In yet another example, the complex system 104 may represent a particular application, such as a commercial application. The particular application may include one or more computer classes that generate output, such as log output, for the particular computer application. The log output generating classes may be considered built-in instrumentation that reports the current state of multiple classes and objects invoked within the particular computer application.

The signal data repository 106 may represent a server computer that is configured (i.e., programmed) to collect signal data produced by the multiple sensors on the complex system 104, store the signal data based on the signal data type, and create a time series for the collected signal data, using one or more stored program that the server computer executes. The signal data repository 106 may also be capable of sending either real-time data or stored signal data to the monitoring display 108 for the purposes of presenting signal data values to a user for monitoring purposes. The signal data repository 106 may also aggregate the signal data to create aggregated statistics showing changes in signal values over periods of time. Embodiments of the signal data repository 106 features are not limited to the features described above. The signal data repository 106 may be implemented using any commercially available monitoring programs and may utilize any monitoring features within the commercially available products.

The monitoring display 108 represents a computer-implemented machine programmed to display the signal data received from the signal data repository 106. The monitoring display 108 may be capable of directly receiving data input from signal data processing system 110.

The signal data processing system 110 is configured to receive a data stream of signal data from the signal data repository 106 and identify physical conditions related to the signal data received. The signal data processing system 110 is further configured to send the identified physical conditions to the external system 102, either by sending data back to the signal data repository 106 or by sending data directly to the monitoring display 108 so that a user can better identify conditions related to the incoming signal data.

The signal data processing system 110 contains specially configured logic including, but not limited to, feature identification logic 112, clustering logic 114, vector classification logic 116, signal receiving logic 118, signal data model maintenance logic 120, condition reporting logic 122, and causal analysis logic 126. Each of these elements comprise executable instructions loaded into a set of one or more pages of main memory, such as RAM, in the signal data processing system 110 which when executed cause the signal data processing system 110 to perform the functions or operations that are described herein with reference to those modules. For example, the feature identification logic 112 may comprise executable instructions loaded into a set of pages in RAM that contain instructions which when executed cause performance of feature identification. The feature identification logic 112 may provide instructions to aggregate the multiple sets of signal data into one or more feature vectors. Feature vectors represent sets of signal data from one or more sensors for a particular range of time. The feature identification logic 112 provides instructions to identify patterns from multiple signal data sets. Patterns are based upon variations across different signals and over a specific period of time. The feature identification logic 112 may also provide instructions to determine the optimal time window size for evaluating multiple sets of signal data in order to identify meaningful patterns. The feature identification logic 112 may provide instruction to reduce the set of signal data points within the time duration window to generate a feature vector of reduced dimensionality. In an alternative embodiment, the feature identification logic 112 provides instruction to aggregated signal data sets to generate feature vectors using a recurrent neural network. The feature identification logic 112 may also provide instruction to create mapping between the signal data sets and their corresponding feature vectors.

The signal receiving logic 118 provides instructions to receive multiple sets of signal data representing observed data values from multiple sensors attached to the complex system 104. The feature identification logic 112 provides instructions to aggregate the multiple sets of signal data into one or more feature vectors. Feature vectors represent sets of signal data from one or more sensors for a particular range of time. The clustering logic 114 provides instructions to generate one or more clusters of feature vectors, in which each cluster is determined by similarly identified attributes from feature vectors. The vector classification logic 116 provides instructions to receive feedback input that describes one or more classification labels that may be assigned to feature vectors based upon previously observed sensor data. The feedback may be characterized as a sample episode. A sample episode includes signal data in the form of a sample feature vector and an assigned classification label for the sample feature vector. The classification label may describe a particularly identified condition that occurred to the complex system 104. The vector classification logic 116 provides further instructions to determine classification labels for the generated clusters of feature vectors. Upon determining classification labels for the generated clusters of feature vectors, the vector classification logic 116 provides instructions to generate and store, within a storage medium, a signal data model that defines identified signal conditions based upon the associated cluster, feature vectors, and classification label. The vector classification logic 116 provides further instructions to update a previously generated signal data model using the identified signal conditions based upon the associated clusters, feature vectors, and classification labels. The signal data model maintenance logic 120 provides instructions to maintain one or more signal data models within digital storage media. The condition reporting logic 122 provides instructions to send identified classification labels that are associated to the one or more feature vectors to the external system 102.

Figure 2:
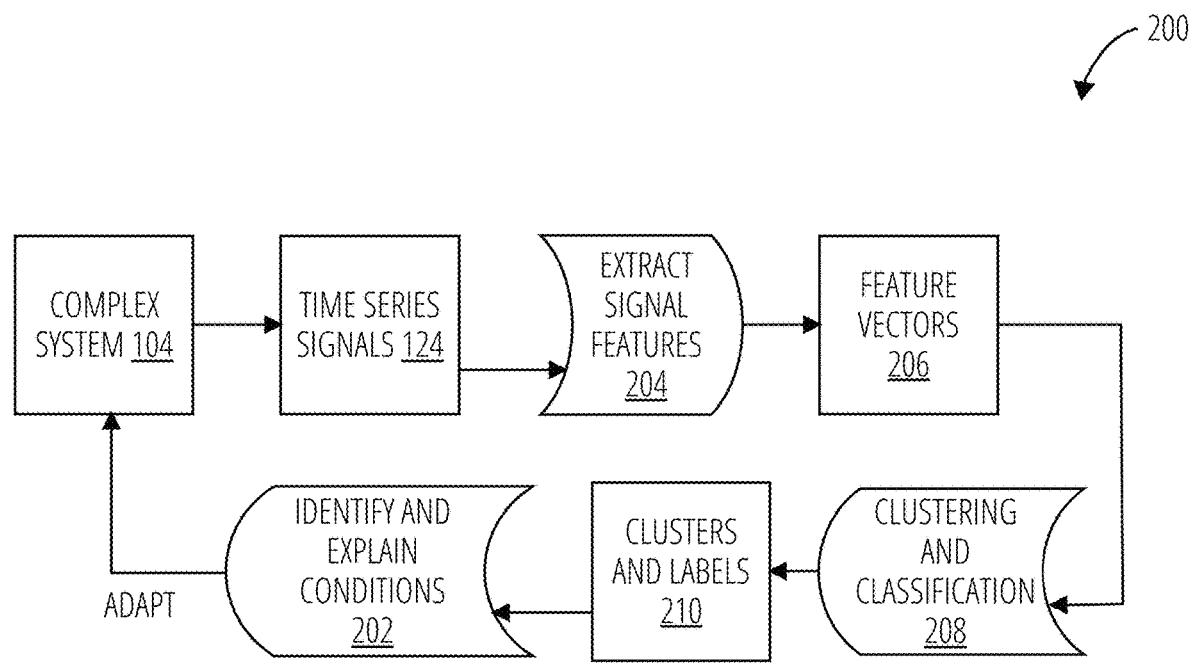
FIG. 2 illustrates a feedback control system 200 in accordance with one embodiment.

Referring to FIG. 2, a feedback control system 200 comprises a complex system 104 that generates time series signals 124. The feedback control system 200 includes logic to extract signal features 204 from the time series signals 124, thus forming feature vectors 206 that are subjected to clustering and classification 208, producing clusters and labels 210 that are used to identify and explain conditions 202 so as to adapt the behavior of the complex system 104.

The remainder of this disclosure describes various embodiments of the causal analysis logic 126.

Figure 3:
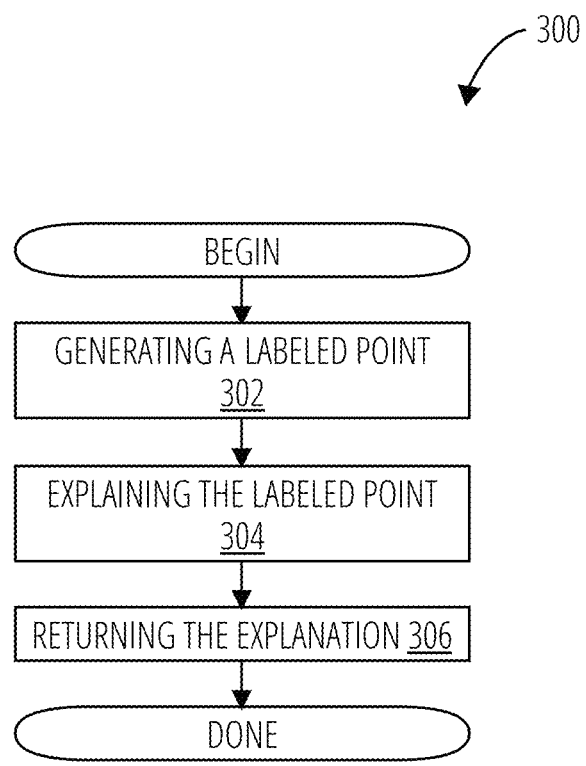
FIG. 3 illustrates a system diagnostic process 300 in accordance with one embodiment.

Referring to FIG. 3, a system diagnostic process 300 comprises generating a labeled point 302, explaining the labeled point 304, and returning the explanation 306. The system diagnostic process 300 provides the high level structure of causal analysis logic 126.

Figure 4:
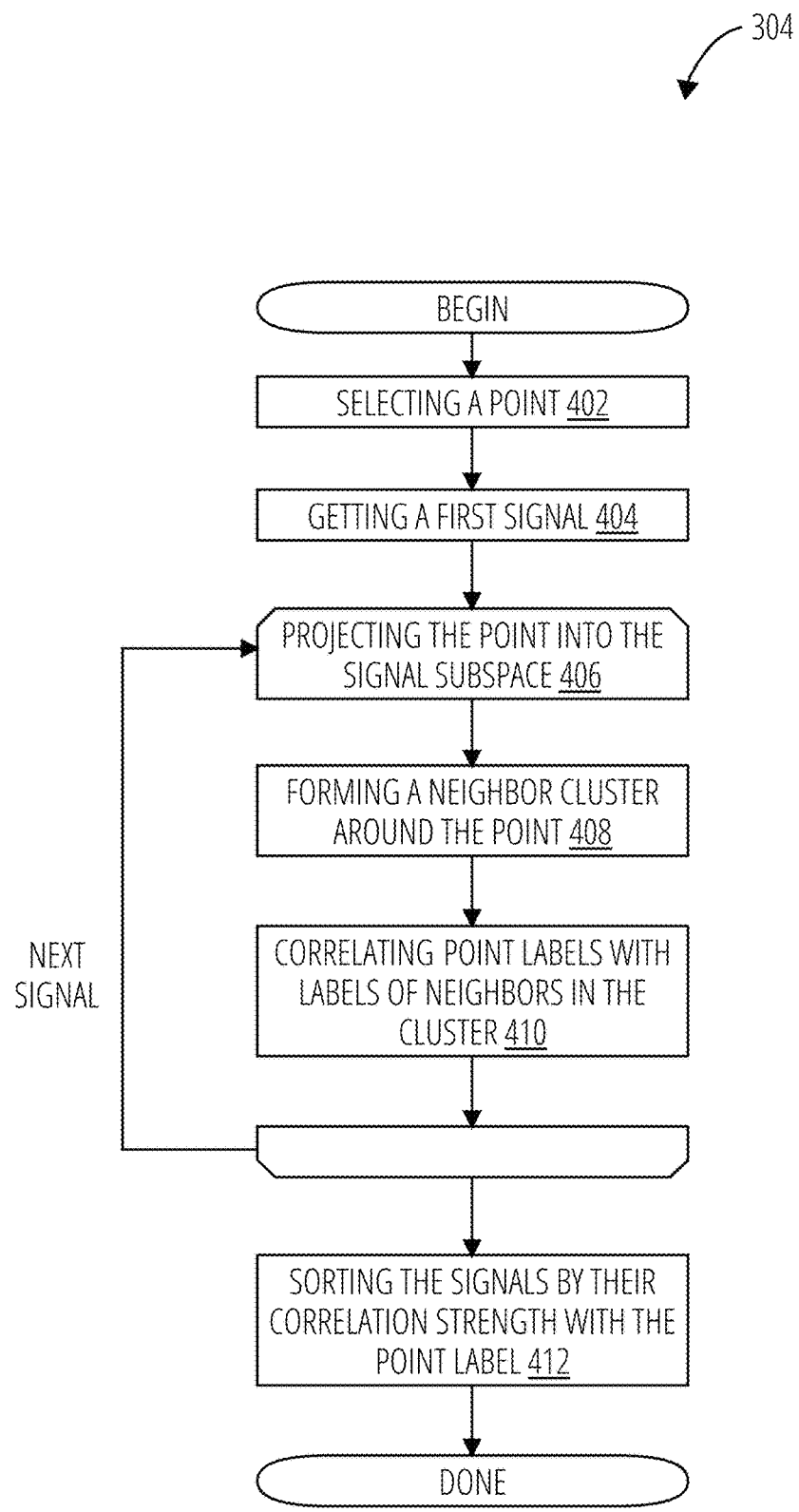
FIG. 4 illustrates explaining the labeled point 304 in accordance with one embodiment.

Referring to FIG. 4, explaining the labeled point 304 comprises, in one embodiment, selecting a point 402, getting a first signal 404, projecting the point into the signal subspace 406, forming a neighbor cluster around the point 408, and correlating point labels with labels of neighbors in the cluster 410. This is repeated for all time-series signals from the system. Explaining the labeled point 304 concludes by sorting the signals by their correlation strength with the point label 412.

Figure 5:
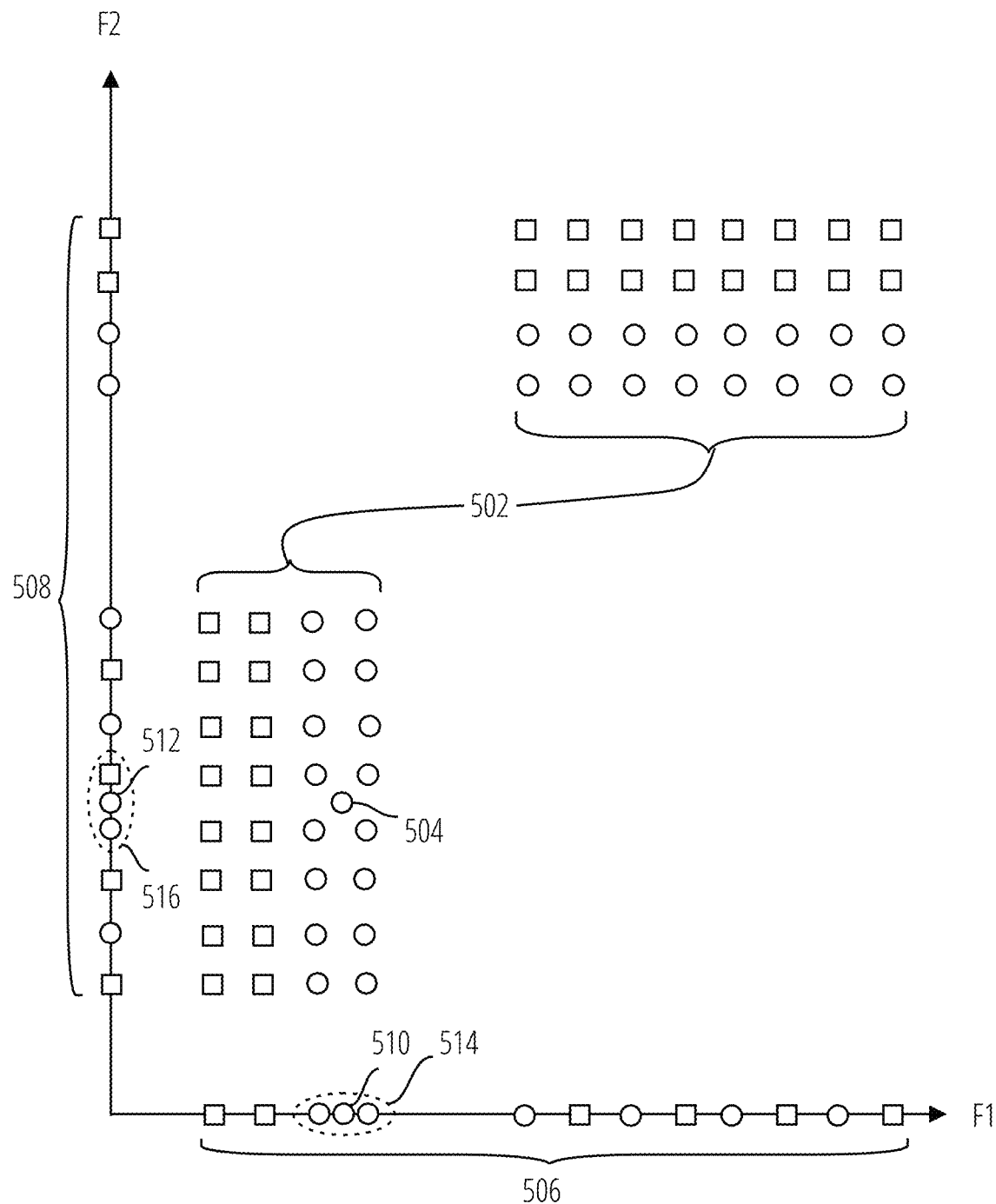
FIG. 5 illustrates an embodiment of projecting the point into the signal subspace 406, forming a neighbor cluster around the point 408, and correlating point labels with labels of neighbors in the cluster 410.

FIG. 5 shows an example of projecting the labeled point into the signal subspace 406, forming a neighbor cluster around the point 408, and correlating point labels with labels of neighbors in the cluster 410.

A first feature axis projection 506 is generated on a first signal feature axis F1, and a second feature axis projection 508 is generated on a second signal feature axis F2. Also generated are a first feature projection of the explanation point 510 (F1 axis) amid a projection of a first feature neighborhood 514 on F1, and a second feature projection of the explanation point 512 amid a projection of a second feature neighborhood 516 on F2.

The system model data 502 is a set of values, C(t), $F_i(t)$, where C(t) is the label and $F_i(t)$ is the feature vector components to be assessed. Here, C(t) is depicted as a circle or a square. These symbols represent the status or condition of a system or device in some embodiments, corresponding to an associated label such as "operational", "non-operational", "warning", "normal", etc. The value of $F_i(t)$ is depicted here as a location in two dimensional space, as two features, F1 and F2, are depicted. In some embodiments, more than two features may be assessed. In the example embodiment, the system model data 502 has 64 values.

The explanation point 504 has a value of C(t'), $F_i(t')$. The C(t'), label, for the explanation point 504 is represented by a circle, which, similar to the system model data 502, represents a status or condition of the system with its own associated label. The explanation point 504 has also been located in the two dimensional space by $F_i(t')$. The explanation point 504 may have been determined utilizing a classification model.

The first feature axis projection 506 is a projection on the first feature axis F1 of the system model data 502 and the explanation point 504. The symbols on F1 represent the 64 projections F1(t) of the system model data 502 and the projection F1(t') for the explanation point 504 onto symbol feature axis F1. As depicted, some of the F1 projections overlap. In these overlapping cases a single symbol is depicted for simplification.

The second feature axis projection 508 is a projection of the system model data 502 and the explanation point 504 onto the second symbol feature axis F2. The symbols on F2 represent the 64 projection values F2(t) for the system model data 502 and the value for F2(t') for the explanation point 504 projected onto F2. Again, some of the symbols on F2 overlap in which case they are depicted as a single symbol.

The first feature neighborhood 514 is a subset of the first feature axis projection 506 projected from a constrained neighborhood around the explanation point 504. The first feature neighborhood 514 may be selected from the first feature axis projection 506 based on the first feature projection of the explanation point 510 and the number of values in the system model data 502. In one embodiment, a number, N, of values is a square root of the total number of values in the system model data 502. Here, N is equal to eight (8). The first feature neighborhood 514 may then be the N (here, eight) points in first feature axis projection 506 closest to the first feature projection of the explanation point 510. A distance function may be utilized to determine the first feature neighborhood 514 from the first feature axis projection 506. The routine may utilize a random selection for points in the first feature axis projection 506 with the same value.

The second feature neighborhood 516 is a subset of the second feature axis projection 508 also projected from the constrained neighborhood around explanation point 504, this time onto axis F2.

Once the first feature neighborhood 514 and the second feature neighborhood 516 has been determined, a metric may be determined for both $F_1$ and $F_2$. The metric may be determined by first determining the percentages of C(t) in the first feature neighborhood 514 and the second feature neighborhood 516 equal to the C(t') of the explanation point 504. In the present example, the percentage for the first feature neighborhood 514 is 100%, and the percentage for the second feature neighborhood 516 is 50%. Next, the overall percentage of C(t)=C(t') is determined (here, 50%). Finally, a ratio of each of the neighborhoods to the overall percentage is determined (for $F_1$, X=2 and for $F_2$, X=1).

Figure 6:
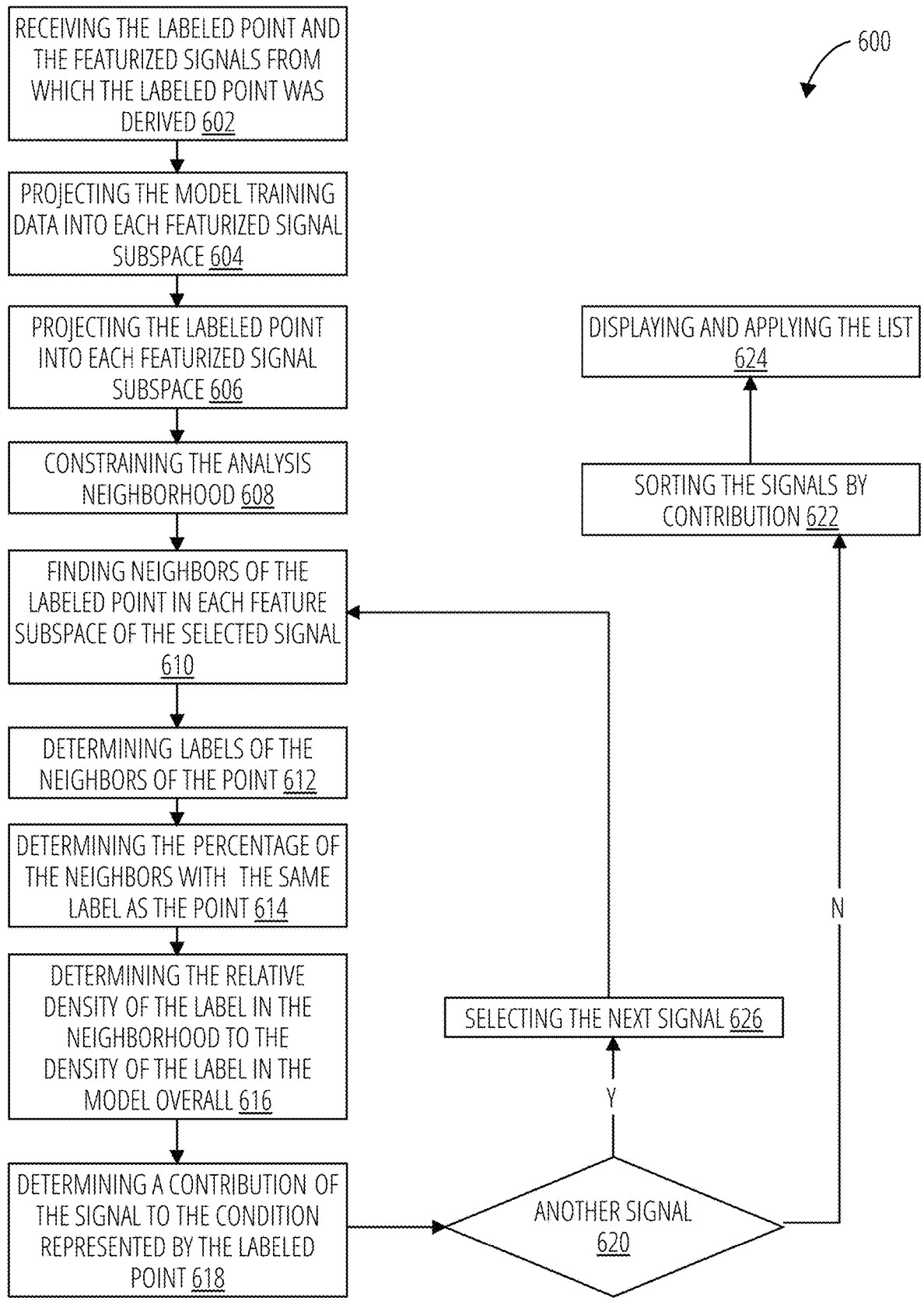
FIG. 6 illustrates a labeled point explanation 600 in accordance with one embodiment.

Referring to FIG. 6, labeled point explanation 600 process comprises receiving the labeled point and the featurized signals from which the labeled point was derived 602, and projecting the model training data into each featurized signal subspace 604 along with projecting the labeled point into each featurized signal subspace 606.

The labeled point explanation 600 continues by constraining the analysis neighborhood 608, and finding neighbors of the labeled point in each feature subspace of the selected signal 610.

By determining labels of the neighbors of the point 612 and determining the percentage of the neighbors with the same label as the point 614, the contribution of the point to known conditions is ascertained. The contribution may be further refined by determining the relative density of the label in the neighborhood to the density of the label in the model overall 616, determining a contribution of the signal to the condition represented by the labeled point 618, and sorting the signals by contribution 622. Signals higher in the sort may be displayed as more likely contributors for the condition associated with the labeled point. In an embodiment, the highest 10% of signals in the sort are displayed, but other ranges could be displayed in other embodiments.

More specifically, a first density of the label of a condition in the neighborhood is computed. The first density could be used to ascertain a contribution of a point to a known condition. A second density of the label in the model overall is also computed to refine the contribution. Therefore, the relative value of the first density to the second density can be used to ascertain a refined contribution.

The signal contribution to the condition associated with the labeled point may then be computed from a ratio or percent of the first ratio and second ratio or the first percent and the second percent.

This process continues for all signals in the model, by checking if there's another signal 620 and if so, selecting the next signal 626 to analyze.

The sorted list of signal contributions is then applied by displaying and applying the list 624 for adapting the complex system from which the signal time series were obtained.

Figure 7:
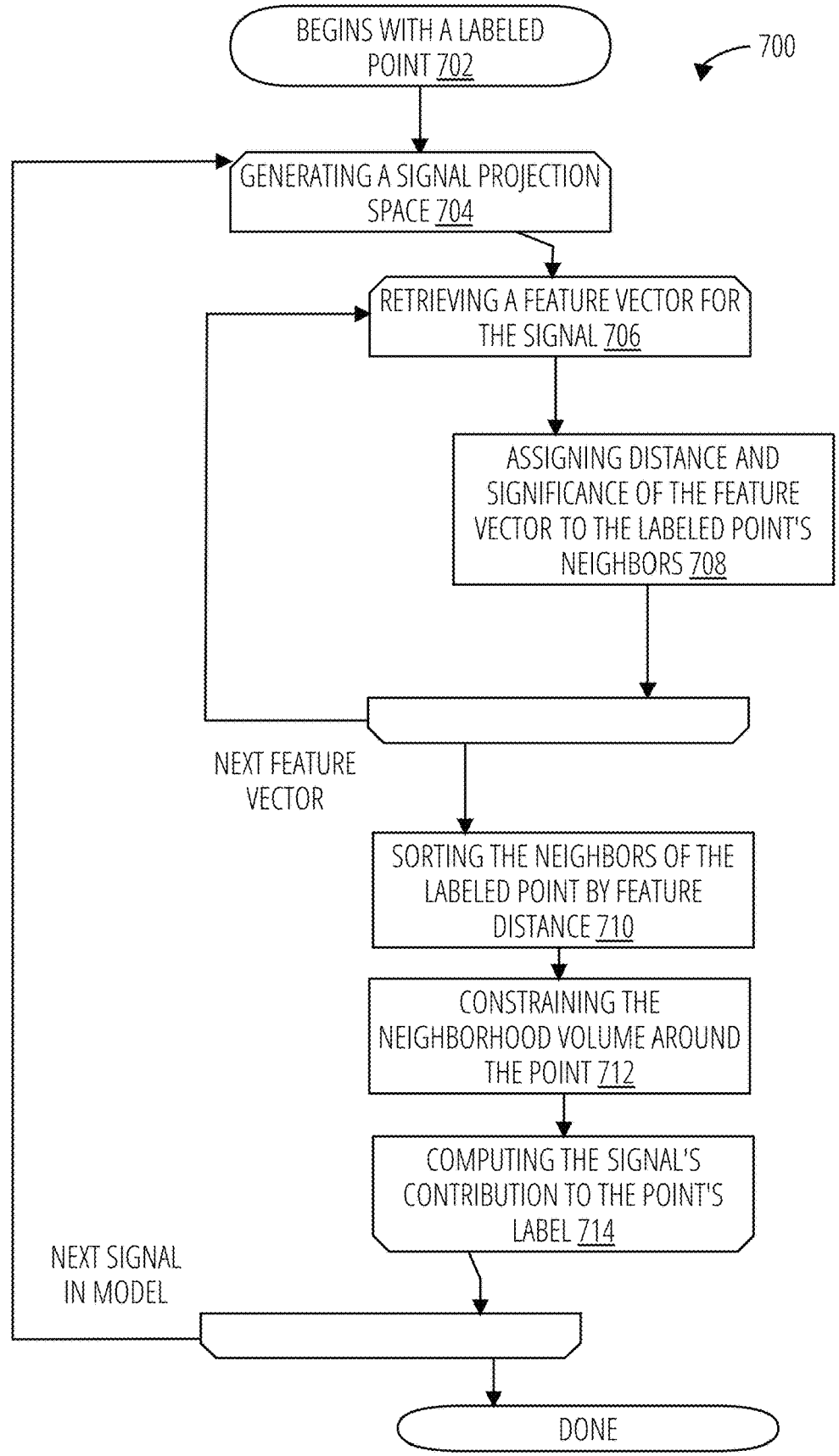
FIG. 7 illustrates an explanation process 700 in accordance with one embodiment.

Referring to FIG. 7, an explanation process 700 begins with a labeled point 702. The explanation process 700 continues by generating a signal projection space 704 for a first signal to analyze, and retrieving a feature vector for the signal 706. These steps are repeated for each signal and each feature vector associated with the selected signal.

The explanation process 700 continues by assigning distance and significance of the feature vector to the labeled point's neighbors 708. This is repeated for each feature vector associated with the signal.

The explanation process 700 continues by sorting the neighbors of the labeled point by feature distance 710, constraining the neighborhood volume around the point 712, and computing the signal's contribution to the point's label 714.

Example logic to implement the explanation process 700 on a computer system is:

```
def explain(point: LabeledPoint): Explanation = {
    // for each signal
    model.signals.map { signal =>
        // project points into signal subspace
        val projectedPoint = project(point, signal)
        val projectedModelPoints = model.points.map(p =>
project(p, signal))
        // constrain neighborhood
        val numNeighbors = sqrt(model.points.size)
        val neighbors = projectedModelPoints.sortBy(p =>
distance(p, projectedPoint)).take(numNeighbors)
        // calculate neighbor correlation
        val percentSameLabelNeighbors =
neighbors.count(_.label == point.label) / neighbors.size
        val percentSameLabelModel =
model.points.count(_.label == point.label) / neighbors.size
        val contributionMetric =
            if (percentSameLabelNeighbors <=
percentSameLabelModel)
                          percentSameLabelNeighbors /
percentSameLabelModel - 1
                     else (percentSameLabelNeighbors -
percentSameLabelModel) / (1 - percentSameLabelModel)
                     (signal, contributionMetric)
    }
}
```

Figure 8:
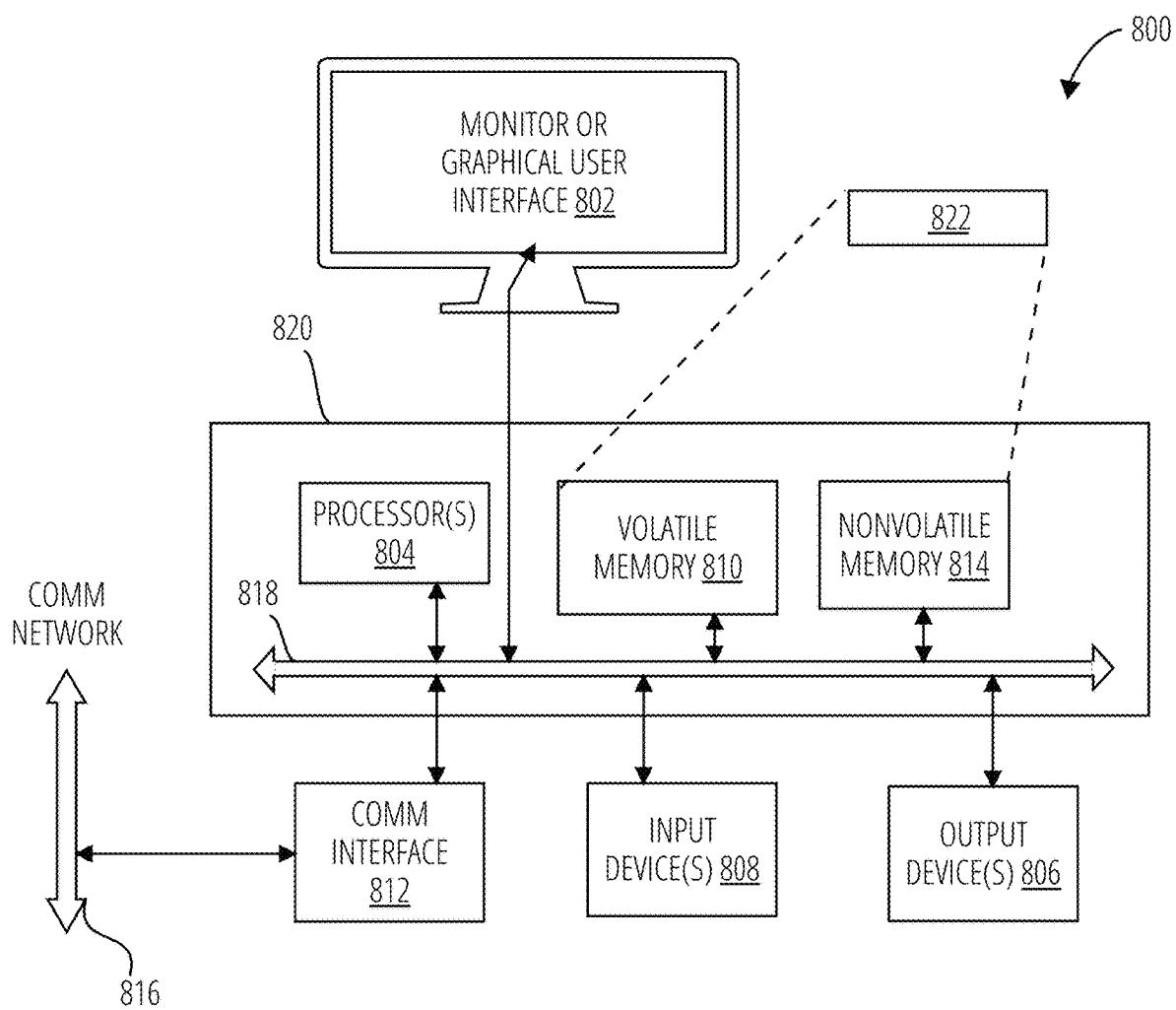
FIG. 8 is an example block diagram of a computing device 800 that may incorporate embodiments of the present invention.

FIG. 8 is an example block diagram of a computing device 800 that may incorporate embodiments of the present invention. FIG. 8 is merely illustrative of a machine system to carry out aspects of the technical processes described herein, and does not limit the scope of the claims. One of ordinary skill in the art would recognize other variations, modifications, and alternatives. In one embodiment, the computing device 800 typically includes a monitor or graphical user interface 802, a data processing system 820, a communication network interface 812, input device(s) 808, output device(s) 806, and the like.

As depicted in FIG. 8, the data processing system 820 may include one or more processor(s) 804 that communicate with a number of peripheral devices via a bus subsystem 818. These peripheral devices may include input device(s) 808, output device(s) 806, communication network interface 812, and a storage subsystem, such as a volatile memory 810 and a nonvolatile memory 814.

The volatile memory 810 and/or the nonvolatile memory 814 may store computer-executable instructions and thus forming logic 822 that when applied to and executed by the processor(s) 804 implement embodiments of the system condition explanation and control processes disclosed herein.

The input device(s) 808 include devices and mechanisms for inputting information to the data processing system 820. These may include a keyboard, a keypad, a touch screen incorporated into the monitor or graphical user interface 802, audio input devices such as voice recognition systems, microphones, and other types of input devices. In various embodiments, the input device(s) 808 may be embodied as a computer mouse, a trackball, a track pad, a joystick, wireless remote, drawing tablet, voice command system, eye tracking system, and the like. The input device(s) 808 typically allow a user to select objects, icons, control areas, text and the like that appear on the monitor or graphical user interface 802 via a command such as a click of a button or the like.

The output device(s) 806 include devices and mechanisms for outputting information from the data processing system 820. These may include the monitor or graphical user interface 802, speakers, printers, infrared LEDs, and so on as well understood in the art.

The communication network interface 812 provides an interface to communication networks (e.g., communication network 816) and devices external to the data processing system 820. The communication network interface 812 may serve as an interface for receiving data from and transmitting data to other systems. Embodiments of the communication network interface 812 may include an Ethernet interface, a modem (telephone, satellite, cable, ISDN), (asynchronous) digital subscriber line (DSL), FireWire, USB, a wireless communication interface such as BlueTooth or WiFi, a near field communication wireless interface, a cellular interface, and the like.

The communication network interface 812 may be coupled to the communication network 816 via an antenna, a cable, or the like. In some embodiments, the communication network interface 812 may be physically integrated on a circuit board of the data processing system 820, or in some cases may be implemented in software or firmware, such as "soft modems", or the like.

The computing device 800 may include logic that enables communications over a network using protocols such as HTTP, TCP/IP, RTP/RTSP, IPX, UDP and the like.

The volatile memory 810 and the nonvolatile memory 814 are examples of tangible media configured to store computer readable data and instructions to implement various embodiments of the processes described herein. Other types of tangible media include removable memory (e.g., pluggable USB memory devices, mobile device SIM cards), optical storage media such as CD-ROMS, DVDs, semiconductor memories such as flash memories, non-transitory read-only-memories (ROMS), battery-backed volatile memories, networked storage devices, and the like. The volatile memory 810 and the nonvolatile memory 814 may be configured to store the basic programming and data constructs that provide the functionality of the disclosed processes and other embodiments thereof that fall within the scope of the present invention.

Logic 822 that implements embodiments of the present invention may be stored in the volatile memory 810 and/or the nonvolatile memory 814. Said logic 822 may be read from the volatile memory 810 and/or nonvolatile memory 814 and executed by the processor(s) 804. The volatile memory 810 and the nonvolatile memory 814 may also provide a repository for storing data used by the logic 822.

The volatile memory 810 and the nonvolatile memory 814 may include a number of memories including a main random access memory (RAM) for storage of instructions and data during program execution and a read only memory (ROM) in which read-only non-transitory instructions are stored. The volatile memory 810 and the nonvolatile memory 814 may include a file storage subsystem providing persistent (non-volatile) storage for program and data files. The volatile memory 810 and the nonvolatile memory 814 may include removable storage systems, such as removable flash memory.

The bus subsystem 818 provides a mechanism for enabling the various components and subsystems of data processing system 820 communicate with each other as intended. Although the communication network interface 812 is depicted schematically as a single bus, some embodiments of the bus subsystem 818 may utilize multiple distinct busses.

It will be readily apparent to one of ordinary skill in the art that the computing device 800 may be a device such as a smartphone, a desktop computer, a laptop computer, a rack-mounted computer system, a computer server, or a tablet computer device. As commonly known in the art, the computing device 800 may be implemented as a collection of multiple networked computing devices. Further, the computing device 800 will typically include operating system logic (not illustrated) the types and nature of which are well known in the art.

Terminology and Interpretation

Terms used herein should be accorded their ordinary meaning in the relevant arts, or the meaning indicated by their use in context, but if an express definition is provided, that meaning controls.

"Circuitry" in this context refers to electrical circuitry having at least one discrete electrical circuit, electrical circuitry having at least one integrated circuit, electrical circuitry having at least one application specific integrated circuit, circuitry forming a general purpose computing device configured by a computer program (e.g., a general purpose computer configured by a computer program which at least partially carries out processes or devices described herein, or a microprocessor configured by a computer program which at least partially carries out processes or devices described herein), circuitry forming a memory device (e.g., forms of random access memory), or circuitry forming a communications device (e.g., a modem, communications switch, or optical-electrical equipment).

"Firmware" in this context refers to software logic embodied as processor-executable instructions stored in read-only memories or media.

"Hardware" in this context refers to logic embodied as analog or digital circuitry.

"Logic" in this context refers to machine memory circuits, non transitory machine readable media, and/or circuitry which by way of its material and/or material-energy configuration comprises control and/or procedural signals, and/or settings and values (such as resistance, impedance, capacitance, inductance, current/voltage ratings, etc.), that may be applied to influence the operation of a device. Magnetic media, electronic circuits, electrical and optical memory (both volatile and nonvolatile), and firmware configured with processor-executable instructions are examples of logic. Logic specifically excludes pure signals or software per se (however does not exclude machine memories comprising software and thereby forming configurations of matter).

"Software" in this context refers to logic implemented as processor-executable instructions in a machine memory (e.g. read/write volatile or nonvolatile memory or media).

Herein, references to "one embodiment" or "an embodiment" do not necessarily refer to the same embodiment, although they may. Unless the context clearly requires otherwise, throughout the description and the claims, the words "comprise," "comprising," and the like are to be construed in an inclusive sense as opposed to an exclusive or exhaustive sense; that is to say, in the sense of "including, but not limited to." Words using the singular or plural number also include the plural or singular number respectively, unless expressly limited to a single one or multiple ones. Additionally, the words "herein," "above," "below" and words of similar import, when used in this application, refer to this application as a whole and not to any particular portions of this application. When the claims use the word "or" in reference to a list of two or more items, that word covers all of the following interpretations of the word: any of the items in the list, all of the items in the list and any combination of the items in the list, unless expressly limited to one or the other. Any terms not expressly defined herein have their conventional meaning as commonly understood by those having skill in the relevant art(s).

What is claimed is:

1. A control method for a machine system comprising sensors generating a plurality of signals over time, the method comprising:
   receiving a labeled point comprising, for a range of time, a first time series from each of the plurality of signals, each first time series being associated with at least one feature vector, each feature vector having components corresponding to one or more signal features, the labeled point having a first label describing a first condition of a plurality of conditions of the machine system, each of the plurality of signals having a corresponding signal projection subspace;
   projecting each of a plurality of model condition points into each signal projection subspace of the plurality of signal projection subspaces,
   each model condition point comprising, for a range of time specific to the model condition point, a respective time series from each of the plurality of signals, each respective time series being associated with at least one feature vector, each feature vector having components corresponding to one or more signal features, the model condition point having a respective label describing one of the plurality of conditions of the machine system, the projecting comprising evaluating the at least one feature vector associated with the respective time series from each of the plurality of signals in the corresponding signal projection subspace;
   projecting the labeled point into each signal projection subspace, comprising evaluating the at least one feature vector associated with the first time series from each of the plurality of signals in the corresponding signal projection subspace,
   wherein in each signal projection space corresponding to a signal of the plurality of signals, the at least one feature vector associated with only the signal from the labeled point and each model condition point are evaluated;
   constraining an analysis neighborhood for the labeled point to a set number of model condition points closest to the labeled point as projected in each signal projection subspace corresponding to a signal of the plurality of signals,
   wherein the respective at least one feature vectors associated with the signal from the set number of model condition points are closest to the at least one feature vector associated with the signal from the labeled point;
   for each signal projection subspace, calculating a first percent of model condition points in the respective analysis neighborhood having a same label as the labeled point in the respective analysis neighborhood out of the set number of model condition points in the analysis neighborhood;
   for each signal projection subspace, calculating a second percent of model condition points having a same label as the labeled point out of the plurality of model condition points;
   calculating a contribution of each of the plurality of signals to the first condition from the first percent and the second percent calculated for the corresponding signal projection subspace, to form a sorted list of signals and contributions; and
   adapting the machine system's behavior based on the sorted list.

2. The control method of claim 1, wherein calculating the contribution of each the signal to the first condition comprises:
   if the first percent is less than or equal to the second percent, setting the contribution of the signal to (first percent/second percent)−1; and
   otherwise, setting the contribution of the signal to (first percent−second percent)/(1−second percent).

3. The control method of claim 1, wherein constraining the analysis neighborhood for the labeled point to the set number of model condition points closest to the labeled point in the signal projection subspace comprises sorting the plurality of model condition points by a distance from the labeled point and limiting the analysis neighborhood to a number of the model condition points having the closest distance.

4. The control method of claim 3, wherein the distance comprises a distance between a projection of the labeled point and projections of the plurality of model condition points on a signal feature axis in the signal projection subspace.

5. The control method of claim 1, wherein adapting the machine system's behavior comprises remediating a faulty component.

6. The control method of claim 1, wherein the set number of the model condition points comprises a square root of a total number of model condition points.

7. A monitoring and alert apparatus for a machine system comprising sensors generating a plurality of signals over time, comprising:
   a computer system comprising a plurality of inputs to receive time series signals from a plurality of sensors;
   the computer system comprising a processor and a memory adapted with instructions forming:
      logic to receive a labeled point comprising, for a range of time, a first time series from each of the plurality of signals, each first time series being associated with at least one feature vector, each feature vector having components corresponding to one or more signal features, the labeled point having a first label describing a first condition of a plurality of conditions of the machine system, each of the plurality of signals having a corresponding signal projection subspace;
      logic to projecting each of a plurality of model condition points into each signal projection subspace of the plurality of signal projection subspaces,
      each model condition point comprising, for a range of time specific to the model condition point, a respective time series from each of the plurality of signals, each respective time series being associated with at least one feature vector, each feature vector having components corresponding to one or more signal features, the model condition point having a respective label describing one of the plurality of conditions of the machine system, the projecting comprising evaluating the at least one feature vector associated with the respective time series from each of the plurality of signals in the corresponding signal projection subspace;
      logic to project the labeled point into each signal projection subspace, comprising evaluating the at least one feature vector associated with the first time series from each of the plurality of signals in the corresponding signal projection subspace,
wherein in each signal projection space corresponding to a signal of the plurality of signals, the at least one feature vector associated with only the signal from the labeled point and each model condition point are evaluated;
logic to constrain an analysis neighborhood for the labeled point to a set number of model condition points closest to the labeled point as projected in each signal projection subspace corresponding to a signal of the plurality of signals,
wherein the respective at least one feature vectors associated with the signal from the set number of model condition points are closest to the at least one feature vector associated with the signal from the labeled point;
logic to calculate, for each signal projection subspace, a first percent of model condition points in the respective analysis neighborhood having a same label as the labeled point in the analysis neighborhood out of the set number of model condition points in the respective analysis neighborhood;
logic to calculate, for each signal projection subspace, a second percent of model condition points having a same label as the labeled point out of the plurality of model condition points;
logic to calculate a contribution of each of the plurality of signals to the first condition from the first percent and the second percent calculated for the corresponding signal projection subspace, to form a sorted list of signals and contributions; and
logic to display signals that are higher in the sorted list of signals as the most likely contributors for the machine system's condition corresponding to the labeled point.

8. The apparatus of claim 7, wherein calculating the contribution of each the signal to the first condition comprises:
if the first percent is less than or equal to the second percent, set the contribution of the signal to (first percent/second percent)−1; and
otherwise, set the contribution of the signal to (first percent−second percent)/(1−second percent).

9. The apparatus of claim 7, wherein constraining the analysis neighborhood for the labeled point to the set number of model condition points closest to the labeled point in the signal projection subspace comprises sorting the plurality of model condition points by a distance from the labeled point and limiting the analysis neighborhood to a number of the model condition points having the closest distance.

10. The apparatus of claim 9, wherein the distance comprises a distance between a projection of the labeled point and projections of the plurality of model condition points on a signal feature axis in the signal projection subspace.

11. The apparatus of claim 7, wherein the first condition comprises a faulty component.

12. The apparatus of claim 7, wherein the set number of the model condition points comprises a square root of a total number of model condition points.

13. A non-transitory machine-readable storage medium storing instructions that when executed by a processor, cause the processor to execute a control method for a machine system comprising sensors generating a plurality of signals over time, the method comprising:
receiving a labeled point comprising, for a range of time, a first time series from each of the plurality of signals, each first time series being associated with at least one feature vector, each feature vector having components corresponding to one or more signal features, the labeled point having a first label describing a first condition of a plurality of conditions of the machine system, each of the plurality of signals having a corresponding signal projection subspace;
projecting each of a plurality of model condition points into each signal projection subspace of the plurality of signal projection subspaces,
each model condition point comprising, for a range of time specific to the model condition point, a respective time series from each of the plurality of signals, each respective time series being associated with at least one feature vector, each feature vector having components corresponding to one or more signal features, the model condition point having a respective label describing one of the plurality of conditions of the machine system, the projecting comprising evaluating the at least one feature vector associated with the respective time series from each of the plurality of signals in the corresponding signal projection subspace;
projecting the labeled point into each signal projection subspace, comprising evaluating the at least one feature vector associated with the first time series from each of the plurality of signals in the corresponding signal projection subspace,
wherein in each signal projection space corresponding to a signal of the plurality of signals, the at least one feature vector associated with only the signal from the labeled point and each model condition point are evaluated;
constraining an analysis neighborhood for the labeled point to a set number of model condition points closest to the labeled point as projected in each signal projection subspace corresponding to a signal of the plurality of signals,
wherein the respective at least one feature vectors associated with the signal from the set number of model condition points are closest to the at least one feature vector associated with the signal from the labeled point;
for each signal projection subspace, calculating a first percent of model condition points in the respective analysis neighborhood having a same label as the labeled point in the respective analysis neighborhood out of the set number of model condition points in the analysis neighborhood;
for each signal projection subspace, calculating a second percent of model condition points in the model having a same label as the labeled point out of the plurality of model condition points;
calculating a contribution of each of the plurality of signals to the first condition from the first percent and the second percent calculated for the corresponding signal projection subspace, to form a sorted list of signals and contributions; and
adapt the machine system's behavior based on the sorted list.

14. The non-transitory machine-readable storage medium of claim 13, wherein calculating the contribution of each the signal to the first condition comprises:
if the first percent is less than or equal to the second percent, setting the contribution of the signal to (first percent/second percent)−1; and otherwise, setting the contribution of the signal to (first percent−second percent)/(1−second percent).

15. The non-transitory machine-readable storage medium of claim 13, wherein constraining the analysis neighborhood for the labeled point to the set number of model condition points closest to the labeled point in the signal projection subspace comprises sorting the plurality of model condition points by a distance from the labeled point and limiting the analysis neighborhood to a number of model condition points having the closest distance.

16. The non-transitory machine-readable storage medium of claim 13, wherein the distance comprises a distance between a projection of the labeled point and projections of the plurality of model condition points on a signal feature axis in the signal projection subspace.

17. The non-transitory machine-readable storage medium of claim 13, wherein adapting the machine system's behavior comprises remediating a faulty component.

18. The non-transitory machine-readable storage medium of claim 13, wherein the set number of model condition points comprises a square root of a total number of model condition points.

\* \* \* \* \*